(12) United States Patent
Anantram et al.

(10) Patent No.: US 9,065,253 B2
(45) Date of Patent: Jun. 23, 2015

(54) STRAIN MODULATED NANOSTRUCTURES FOR OPTOELECTRONIC DEVICES AND ASSOCIATED SYSTEMS AND METHODS

(75) Inventors: Manjeri P. Anantram, Seattle, WA (US); Daryoush Shiri, Waterloo (CA)

(73) Assignee: University of Washington through its Center for Commercialization, Seattle, WA (US)

( * ) Notice: Subject to any disclaimer, the term of this patent is extended or adjusted under 35 U.S.C. 154(b) by 176 days.

(21) Appl. No.: 12/778,857

(22) Filed: May 12, 2010

(65) Prior Publication Data
US 2010/0290217 A1    Nov. 18, 2010

Related U.S. Application Data

(60) Provisional application No. 61/177,823, filed on May 13, 2009.

(51) Int. Cl.
| | |
|---|---|
| *H01S 5/00* | (2006.01) |
| *H01S 5/34* | (2006.01) |
| *B82Y 20/00* | (2011.01) |
| *H01S 5/06* | (2006.01) |
| *H01L 33/18* | (2010.01) |
| *H01S 5/022* | (2006.01) |
| *H01S 5/04* | (2006.01) |

(52) U.S. Cl.
CPC .............. *H01S 5/341* (2013.01); *B82Y 20/00* (2013.01); *H01L 33/18* (2013.01); *H01S 5/02248* (2013.01); *H01S 5/041* (2013.01); *H01S 5/0607* (2013.01); *H01S 5/0612* (2013.01); *H01S 5/3403* (2013.01)

(58) Field of Classification Search
CPC ... H01S 5/0265; H01S 5/0607; H01S 5/3031; H01S 5/3201; H01S 5/3403; H01S 5/341

USPC ............... 372/20, 28, 38.03, 45.011; 977/951
See application file for complete search history.

(56) References Cited

U.S. PATENT DOCUMENTS

| | | | |
|---|---|---|---|
| 2002/0172820 A1* | 11/2002 | Majumdar et al. | ............ 428/357 |
| 2003/0205710 A1 | 11/2003 | Gardner et al. | |
| 2009/0121213 A1* | 5/2009 | Balkenende et al. | ........... 257/13 |

OTHER PUBLICATIONS

Shiri et al. ("Electromechanical Response of Silicon Nanowires: Bandgap and Effective Mass", ISDRS Dec. 12-Dec. 14, 2007).*
Bao, J. et al., Broadband ZnO Single-Nanowire Light-Emitting Diode, Nano Letters, vol. 6, No. 8, 1719-1722 (2006).
Bertness, K.A. et al., A Brighter Future From Gallium Nitride Nanowires, CrossTalk, The Journal of Defense Software Engineering, Oct. 2006, URL: http://www.stsc.hill.af.mil/crosstalk/2006/10/0610BertnessSanfordDavydov.html.

(Continued)

*Primary Examiner* — Tod T Van Roy
(74) *Attorney, Agent, or Firm* — Perkins Coie LLP

(57) ABSTRACT

Strain modulated nanostructures for optoelectronic devices and associated systems and methods are disclosed. A semiconductor laser in accordance with one embodiment of the disclosure, for example, comprises an active region having a nanowire structure formed from a semiconductor material. The nanowire structure of the semiconductor material has a bandgap that is indirect in a first strain state. The laser further includes a straining unit coupled to the active region. The straining unit is configured to modulate the nanowire structure such that the nanowire structure reaches a second strain state in which the bandgap becomes direct or substantially direct and, in operation, emits photons upon electron-hole recombination.

5 Claims, 10 Drawing Sheets

(56) References Cited

OTHER PUBLICATIONS

Bullis, K., Nanowire LEDs, Technology, Review, Aug. 1, 2007, URL: http://www.technologyreview.com/Nanotech/19129/?a=f.

Hewett, J., GaN nanowire laser emits first light, Sep. 24, 2002, URL: http://nanotechweb.org/cws/article/tech/9933.

Kong, Y. et al., First-principle investigation of strain effects on the electronic properties of germanium nanowires, Phys Status Solidi RRL 3, No. 9, 281-283 (2009).

Maslov, A.V. et al., Size reduction of a semiconductor nanowire laser using metal coating, Physics and Simulation of Optoelectronic Devices XV, Ed. M. Osinski et al., Proceedings of the SPIE, vol. 6468, 646801, 2007.

Nanowire lasers: Customized wrapping, NPG Asia Materials ISSN 1884-4049 EISSN 1884-4057, Tokyo Institute of Technology, Feb. 10, 2009, URL: http://www.natureasia.com/asia-materials/highlight.php?id=377.

Ning, C-Z., Nanolasers based on nanowires and surface plasmons, SPIE Newsroom, DOI: 10.1117/2.1200901.1486, Jan. 30, 2009.

Rong, H. et al., An all-silicon Raman laser, Nature, vol. 433, 292-294, Jan. 20, 2005.

Shiri, D. et al., Strain induced change of bandgap and effective mass in silicon nanowires, Applied Physics Letters 93 073114 (2008).

Yang, P. One-Dimensional Nanostructures as Subwavelength Optical Elements for Photonics Integration, Jul. 20, 2005, URL: http://instrumentationcolloquium.lbl.gov/Nanostructures_and_Photonics_Integration.pdf.

Zimmler, M.A. et al, Optically pumped nanowire lasers: invited review, Semiconductor Science and Technology, 25 (2010) 024001.

Cao, Linyou et al., "Enhanced Raman Scattering from Individual Semiconductor Nanocones and Nanowires", The American Physical Society, 2006.

Christiansen, S.H. et al., "Signal enhancement in nano-Raman spectroscopy by gold caps on silicon nanowires obtained by vapour-liquid-solid growth", Downloaded on Dec. 22, 2014 from IOPscience. iopscience.iop.org., 2007.

Cullis, A. G. et al., "Visible light emission due to quantum size effects in highly porous crystalline silicon", Letters to Nature. vol. 353, Sep. 26, 1991, 335-338.

Gale, Julian D. et al., "The General Utility Lattice Program", Molecular Simulation. vol. 29(5), 2003, 291-341.

He, Rongrui et al., "Giant Piezoresistance effect in silicon nanwires", Nature Nanotechnology. vol. 1. www.nature.com/naturenanotechnology, 2006, 42-46.

Holmes, Justin D. et al., "Control of Thickness and Orientation of Solution-Grown Silicon Nanowires", www.sciencemag.com., 2000, 1471-1473.

Ishikawa, Yasuhiko et al., "Strain-induced band gap shrinkage in Ge grown on Si substrate", Applied Physics Letters, 2003.

Jancu, Jean-Marc et al., "Empirical spds* tight-binding calculation for cubic semiconductors: General method and material parameters", The American Physical Society, 1998.

Kikkawa, J. et al., "Enhanced direct interband transitions in silicon nanowires studied by electron energy-loss spectroscopy", The American Physical Society, 2007.

Kizuka, Tokushi et al., "Measurements of the atomistic mechanics of single crystalline silicon wires of nanometer width", The American Physical Society, 2005.

Koo, Sang-Mo et al., "Enhanced Channel Modulation in Dual-Gated Silicon Nanowire Transistors", The American Chemical Society, 2005.

Lee, Byeongchan et al., "First-principles study of the Young's modulus of Si <001> nanowires", The American Physical Society, 2007.

Li, Qiliang et al., "Silicon nanowire on oxide/nitride/oxide for memory application", Downloaded on Dec. 22, 2014 from IOPscience. www.iopscience.iop.org., 2007.

Ma, D. et al., "Small-Diameter Silicon Nanwire Surfaces", www.sciencemag.org., 2003, 1874-1877.

Maki, Hideyuki et al., "Direct Observation of the Deformation and the Band Gap Change from an Individual Single-Walled Carbon Nanotub under Uniaxial Strain", The American Chemical Society, Mar. 15, 2007.

Menendez, J. et al., "Type-I GE/Ge 1-x-y Si x Sn y strained-layer heterostructures with a direct Ge bandgap", Applied Physics Letters, 2004.

Menon, Madhu et al., "Nanomechanics of silicon nanowires", The American Physical Society, 2004.

Niquet, Y.M. et al., "Electronic structure of semiconductor nanowires", The American Physical Society, 2006.

Sham, T.K. et al., "Electronic structure and optical properties of silicon nanowires: A study using x-ray excited optical luninescence and x-ray emission spectrospcopy", The American Physical Society, 2004.

Soref, Richard A. et al., "Direct-Gap Ge/GeSn/Si and GeSn/Ge/Si Heterostructures", Superlattices and Microstructures. vol. 14, No. 2/3, 1993.

Stampfer, C. et al., "Fabrication of Single-Walled Carbon-Nanotube-Based Pressure Sensors", The American Chemical Society, 2006, 233-237.

Stern, Eric et al., "Label-free immunodetection with CMOS-compatible semiconducting nanowires", Nature. vol. 445, Feb. 1, 2007.

Svizhenko, Alexei et al., "Effect of growth orientation and surface roughness on electron transport in silicon nanowires", The American Physical Society, 2007.

Tersoff, J. et al., "New empirical approach for the structure and energy of covalent systems", The American Physical Society, 1988.

Tian, Bozhi et al., "Coaxial silicon nanowires as solar cells and nanoelectronic power sources", Nature. vol. 449, Oct. 18, 2007.

Vo, T. et al., "First principles imulations of the structural and electronic properties of silicon nanowires", The American Physical Society, 2006.

Wu, Yue et al., "Controlled Growth and Structures of Molecular-Scale Silicon Nanowires", Department of Chemistry and Chemical Biology. Harvard University, 2004, 433-436.

Xiang, Jie et al., "Ge/Si nanowire heterstructures as high-performance field-effect transistors", Nature. vol. 441, May 25, 2006.

Yan, Jia-An et al., "Size and orientation dependence in the electronic properties of silicon nanowires", The American Physical Society, 2007.

Yang, Liu et al., "Band-gap change of carbon nanotubes: Effect of small uniaxial and torsional strain", The American Physical Society, 1999.

Zheng, Yun et al., "Electronic Properties of Silicon Nanowires", IEEE Transactions on Electron Devices. vol. 52, No. 6, Jun. 2005.

\* cited by examiner

STRAIN MODULATED NANOSTRUCTURES FOR OPTOELECTRONIC DEVICES AND ASSOCIATED SYSTEMS AND METHODS

CROSS-REFERENCE TO RELATED APPLICATION

This application claims priority to pending U.S. Provisional Patent Application No. 61/177,823 entitled "STRAINED SILICON AND GERMANIUM BASED LASERS AND PHOTODETECTORS," filed May 13, 2009, and incorporated herein by reference in its entirety.

TECHNICAL FIELD

The disclosed technology relates generally to semiconductor devices and nanostructures and, in particular, to strain modulated nanostructures for optoelectronic devices and associated systems and methods.

BACKGROUND

Semiconductor nanostructures have gained research and industrial attention for integration into optoelectronic devices, optical systems, and the like. For example, reduced dimensions of nanostructures potentially enable additional miniaturization of optoelectronic devices for use in applications such as mobile computing devices, telecommunication devices and components, solid state lighting devices, high density storage devices, etc. Studies have also demonstrated that nanostructures (e.g., nanowires, quantum dots, or other 2D, 1D, 0D structures), can potentially hold lower threshold currents and higher optical efficiencies.

Existing studies, however, are generally limited to nanostructures made from direct bandgap materials such as III-V compounds (e.g., GaN, InGaN, GaAs, etc.) suitable for radiative recombination. One concern with such direct bandgap materials is that they are limited in development, scalability, and commercialization potential due to cost, yield, relative immaturity of processing/fabrication techniques and availability of sophisticated fabrication facilities to make these devices.

DETAILED DESCRIPTION

The present disclosure is directed to strain modulated nanostructures (e.g., nanowires, arrays of nanowires, etc.) for optoelectronic devices and associated systems and methods. Indirect bandgap materials such as bulk silicon and germanium are poor light emitters. As such, these materials typically have not been used in optoelectronic devices as the active light emitting/absorbing material. The present disclosure describes nanostructures (e.g., made of silicon, germanium, or other direct and indirect bandgap materials) whose bandgap can transition between direct and indirect through strain manipulation. By straining the active region of the nanostructures, the bandgap becomes direct and suitable for light emission and/or absorption or indirect where they have a long life time in the excited state.

Although embodiments of the present technology are described with reference to optoelectronic devices such as light emitting diodes, lasers, photodiodes, solar cells, a variety of other optoelectronic or other suitable devices may incorporate aspects of this technology. The techniques and devices disclosed herein are also applicable to any other optoelectronic device whereby light absorption/emission characteristics can be modulated by applying mechanical strain to the active region.

Furthermore, embodiments of the present technology are described herein with reference to nanostructures (e.g., nanowires, etc.), but are not limited as such. The techniques and devices disclosed herein are generally applicable to any structure, material, and/or form factor whereby light absorption/emission characteristics can be modulated by applying/removing mechanical strain in the active region (material), e.g., by way of manipulating band structure reversibly between radiation effective (e.g., direct) and non-efficient radiative (e.g., indirect bandgap) forms.

Many specific details of certain embodiments of the disclosure are set forth in the following description and in FIGS. 1A-7 to provide a thorough understanding of these embodiments. A person skilled in the art, however, will understand that the disclosure may be practiced without several of these details or additional details can be added to the disclosure. Well-known structures and functions have not been shown or described in detail to avoid unnecessarily obscuring the description of the embodiments of the disclosure.

Figure 1A:
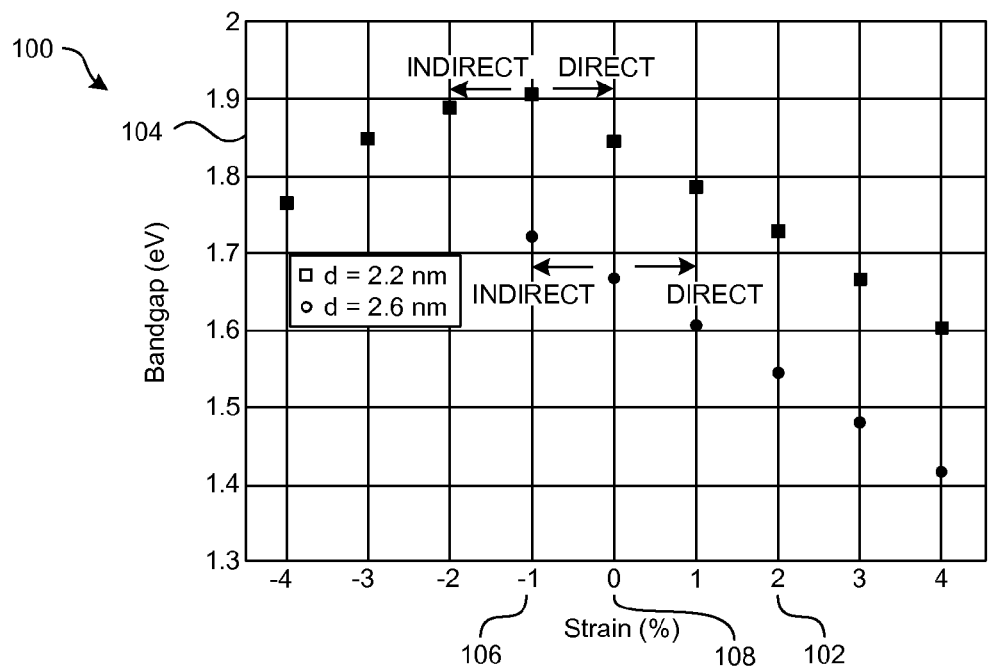
FIG. 1A is an example plot of bandgap vs. strain illustrating how the application of strain to [100] silicon nanowires causes the bandgap structure of the nanowires to transition between direct and indirect.

FIG. 1A is an example plot 100 of bandgap 104 vs. strain 102 illustrating how the application of strain to [100] silicon nanowires causes the bandgap structure of the nanowires to transition between direct and indirect. As shown in plot 100, silicon nanowire has a band structure that is strain dependent. In particular, modulation of strain (e.g., by applying compressive or tensile stress) causes the band structure to change such that the bandgap shifts (in this case reversibly) between direct and indirect. This phenomenon is depicted in the plot for silicon nanowires of two different diameters (i.e., 2.2 nm and 2.6 nm). In one example, the direct-indirect transition can occur at a compressive axial strain of approximately −1% (as shown by reference number 106) for 2.2 nm diameter nanowire. This transition in silicon nanowires and other nanostructures typically varies (e.g., based on dimensions, such as the diameter of the nanowire). In another example, the transition between indirect and direct bandgap occurs at approximately 0% strain with direct bandgap in the tensile strain region and indirect bandgap in the compressive strain region (as shown by reference number 108). In general, for silicon nanostructures (e.g., nanowires), direct bandgap structure can be obtained with increasing tensile strain at different diameters, while indirect bandgap structure can be obtained with increasing compressive strain. Note that although variation of the bandgap structure is shown for [100] silicon nanowires, nanowires in other directions can also have same/similar properties and can be used in the presently disclosed innovation, as shown in the examples of FIGS. 1C-1E.

The bandgap energy value (Eg) of silicon nanowires also changes with different strain states and diameters. Specifically, for silicon the bandgap decreases linearly with increasing tensile strain (>0) above a certain strain value, and decreases again with increasing compressive strain below the certain strain value. One advantage of this feature is that optoelectronic devices including silicon nanowires can have tunable wavelengths using both strain and/or diameter.

Figure 1B:
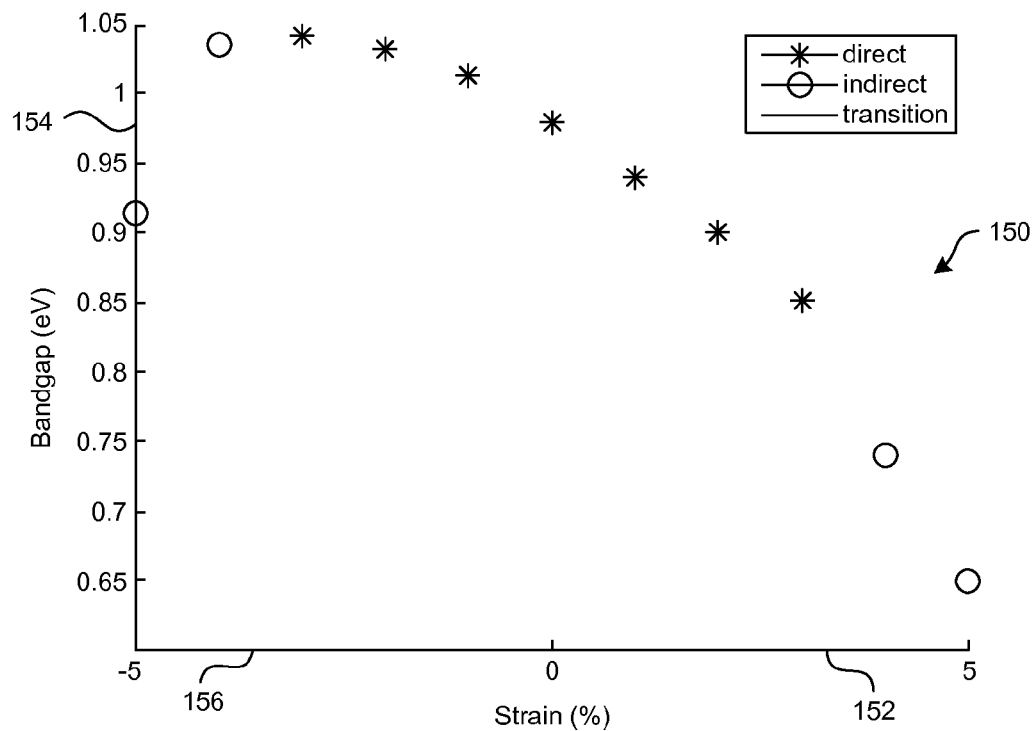
FIG. 1B is an example plot of bandgap vs. strain illustrating how the application of strain to [110] germanium nanowires causes the bandgap structure of the nanowires to transition between direct and indirect.

FIG. 1B is an example plot 150 of bandgap 154 vs. strain 152 illustrating how the application of strain to [110] germanium nanowires causes the bandgap structure of the nanowires to transition between direct and indirect. As shown in plot 150, germanium nanowire is another example of a nanostructure having a band structure that is strain dependent. Similar to silicon nanowires, modulation of strain (e.g., compressive or tensile) causes the band structure to change such that the bandgap structure shifts (reversibly) between direct and indirect. This phenomenon is depicted in the plot 150 for germanium nanowires having a diameter of approximately 1.7 nm. In this example, the direct-indirect transition can occur at a compressive axial strain of approximately 4% (as shown by reference number 156), though this transition varies based on the diameter of the wire. In general, for germanium nanostructures (e.g., nanowires), direct to indirect bandgap transition can be obtained with either compressive or tensile strain depending on the nanowire direction and diameter. Note that although variation of the bandgap structure is shown for [110] germanium nanowires, nanowires in other directions can also have same/similar properties and can be used in the presently disclosed innovation, as shown in the examples of FIGS. 1C-1E.

Figure 1C:
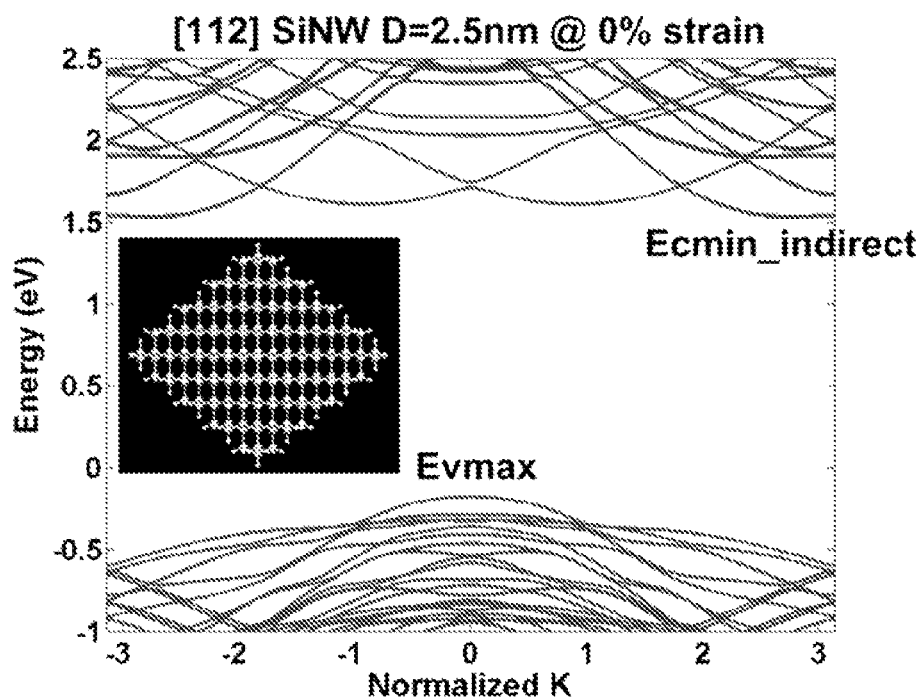
FIG. 1C is an example plot of bandgap vs. strain illustrating how the application of strain to [112] silicon nanowires causes the bandgap structure of the nanowires to transition between direct and indirect.
Figure 1D:
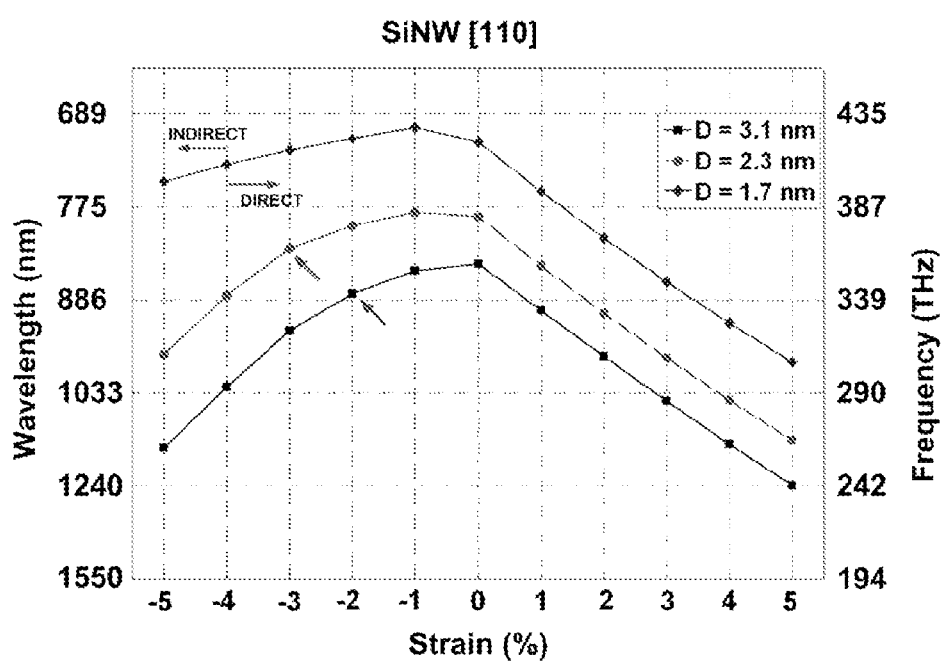
FIG. 1D is an example plot of bandgap vs. strain illustrating how the application of strain to [110] silicon nanowires causes the bandgap structure of the nanowires to transition between direct and indirect.
Figure 1E:
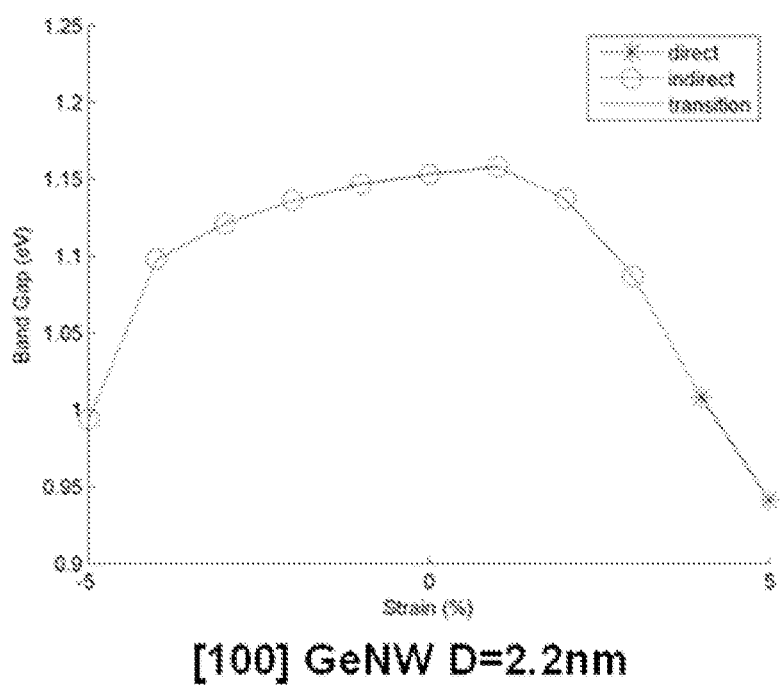
FIG. 1E is an example plot of bandgap vs. strain illustrating how the application of strain to [100] germanium nanowires causes the bandgap structure of the nanowires to transition between direct and indirect.

FIGS. 1C-1E illustrate bandgap structure data for additional crystalline directions in silicon and germanium. More specifically, FIG. 1C is an example plot of bandgap vs. strain illustrating how the application of strain to [112] silicon nanowires (SiNW) causes the bandgap structure of the nanowires to transition between direct and indirect. In addition, FIG. 1D is an example plot of bandgap vs. strain illustrating how the application of strain to [110] silicon nanowires (SiNW) causes the bandgap structure of the nanowires to transition between direct and indirect. Likewise, FIG. 1E is an example plot of bandgap vs. strain illustrating how the application of strain to [100] germanium nanowires (GeNW) causes the bandgap structure of the nanowires to transition between direct and indirect.

Indirect bandgap materials/structures can be used as active material (e.g., for light emission and/or absorption) in optoelectronic devices by leveraging this property. Specifically, optoelectronic devices can include materials (e.g., Si, Ge, SixGe1-x, etc.) and nanostructures (e.g., nanowires, nanodots/quantum dots, thin disks where the spontaneous emission rate can change due to a change in the symmetry of the wave function etc.) with an indirect bandgap structure that can be strain modulated such that the bandgap structure becomes direct or near direct to improve/enhance/optimize radiative recombination efficiency and/or light absorption efficiency. Further, in some embodiments, the device can be operably coupled to a straining device/unit to modulate the active region into and out of direct/indirect bandgap zones. This phenomenon is described in further detail below with reference to FIG. 2.

Figure 2:
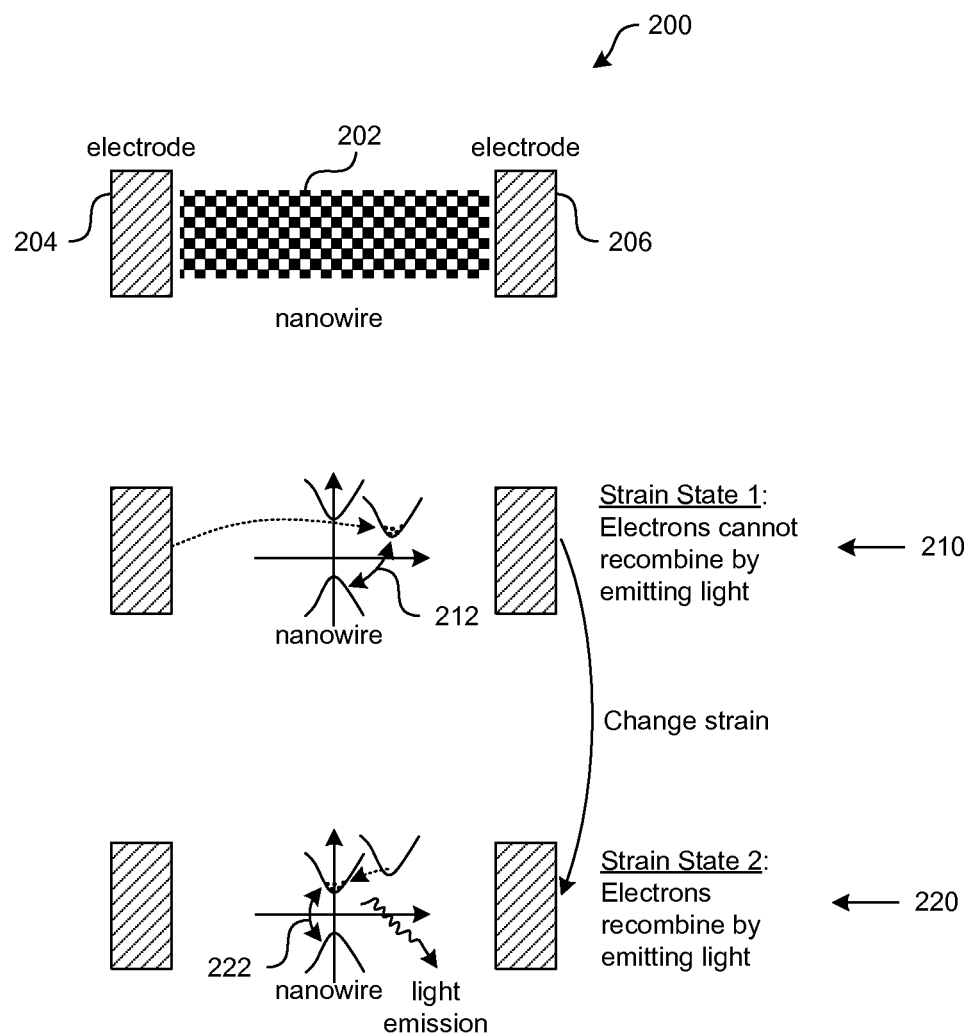
FIG. 2 is a schematic illustration of a nanowire assembly configured in accordance with an embodiment of the disclosure.

FIG. 2, for example, is a schematic illustration of a nanowire assembly 200 configured in accordance with an embodiment of the disclosure. In particular, FIG. 2 illustrates an example of using an indirect bandgap material in a nanowire 202 for emitting or absorbing light by changing the bandgap structure through strain manipulation. The nanowire 202, for example, may be coupled to a first electrode 204 and a second electrode 206 in an optoelectronic device. The first and second electrodes 204 and 206 are configured to bias the nanowire 202 for light emission or to collect photocurrent generated from the nanowire 202. In strain state 1 (as shown by reference number 210), the nanowire 202 has an indirect bandgap 212. In this strain state and in the situation that the optoelectronic device is a laser, the first and second electrodes 204 and 206 can be used to electrically bias the nanowire 202 for population inversion such that electrons can accumulate without recombining with holes.

In a laser, the active region having the nanowire 202 can also be optically pumped to reach inversion (e.g., first and second electrodes 204 and 206 are optional). Electrons in the indirect conduction band of the nanowire 202 have a higher lifetime such that population inversion can occur effectively and efficiently. Furthermore, in the indirect band 212, the electrons cannot recombine with holes radiatively. In some instances, strain modulation for bandgap structure manipulation can be used to change a direct bandgap material (e.g., GaAs, AlGaAs, GaN, InP, etc.) to be temporarily indirect. In a laser application, a direct bandgap material can be strain modulated to be indirect to enhance population inversion due to the increased carrier lifetime in the indirect bandgap state. The material can then be modulated to become direct bandgap for lasing.

By changing the strain of the nanowire 202 into strain state 2 (as shown by reference number 220), the bandgap structure becomes direct 222. Thus, the electrons injected into the conduction band from the population inversion achieved in diagram 210 for a laser can now radiatively recombine for light emission. The strain can be induced by applying mechanical stress, either directly to the nanowire 202 or indirectly through coupling of a straining/stressing unit that is able to exert force on the nanowire 202, to cause stress-inducing strain. In other embodiments, any known or convenient method of inducing strain and changing the strain state of the nanowire between states 1 and 2 (and any other states) can be used. Some example topologies and technologies for inducing strain in the active region (e.g., in the nanostructure) are described below with reference to FIG. 4-6C.

In embodiments where the nanowire 202 is used in a light emitting diode, a photodetector, or a solar cell (e.g., any optoelectronic device where population inversion is not needed), the nanowire 202 may not need to be in strain state 1 for operation. For example, the nanowire 202 can be maintained at the direct bandgap state in strain state 2 for light emission (e.g., by biasing the first and second electrodes 204 and 206) and/or absorption.

Figure 3A:
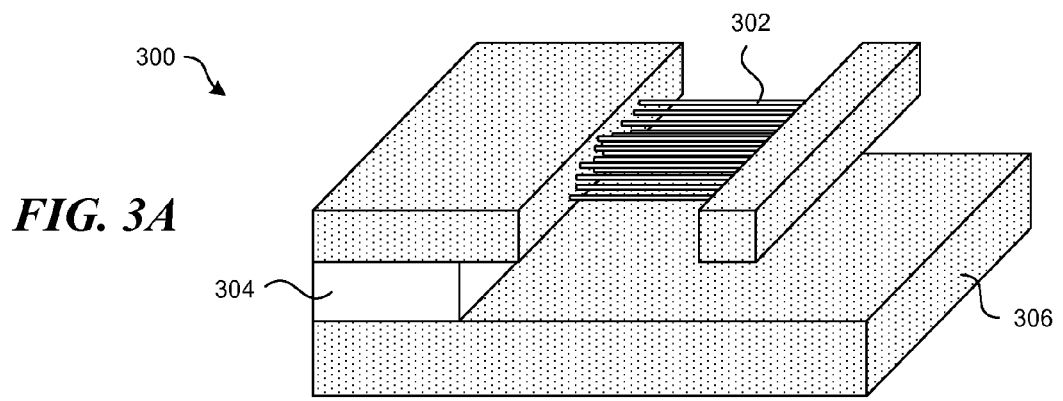
FIG. 3A is a schematic, isometric illustration of nanostructures for use with an optoelectronic device in accordance with an embodiment of the disclosure.

FIG. 3A is a schematic, isometric illustration of nanostructures 300 for use with an optoelectronic device (not shown) in accordance with an embodiment of the disclosure. In the illustrated embodiment, the nanowire structure 300 includes a nanowire bridge 302 made of silicon and fabricated on a silicon-on-insulator (SOI) substrate. The bridge 302, for example, can be made from (110) silicon, a first layer 304 composed of buried oxide, and a second layer 306 composed of silicon. The nanowire bridge 302 can be composed of silicon or any other indirect bandgap material with a bandgap that can be strain engineered such that it is direct or near direct. Such materials include, but are not limited to germanium, silicon germanium compound, GaP, BN, SiC, and/or $Al_xGaAs_{1-x}$.

One feature of the nanowire structure 300 is that conventional CMOS fabrication techniques and equipment can be used to form the nanowire bridge 302 made of silicon and fabricated on a SOI substrate. For example, the device 300 can be fabricated using a combination of top-down (e.g., for mesa and trench formation) and bottom-up (e.g., nanowire growth) methods. In other embodiments, however, other techniques and/or equipment can be used to form the device 300.

Figure 3B:
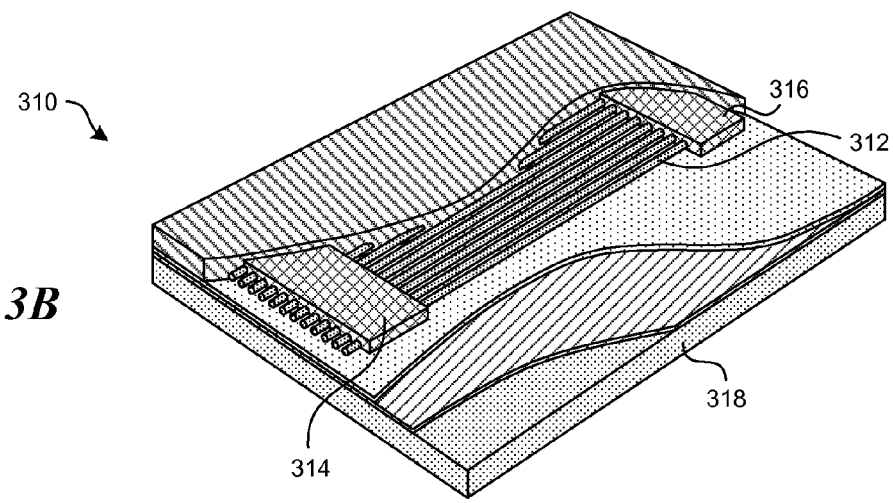
FIG. 3B is a schematic, isometric illustration of an example optoelectronic device having nanostructures configured in accordance with another embodiment of the disclosure.

FIG. 3B is a schematic, isometric illustration of an example optoelectronic device 310 having nanostructures 312 configured in accordance with another embodiment of the disclosure. The optoelectronic device 310 can include, for example, a light emitting or light absorbing device such as a laser diode, a light emitting diode, a photodetector, a solar cell, or the like. The nanostructures 312 can include, a single nanowire, a plurality of nanowires or a nanowire array formed from a substrate layer 318. In one embodiment, for example, the nanostructures 312 include a material having a first band structure in a first strain state and a second band structure in a second strain state. The nanostructures 312 can be modulated (e.g., via strain manipulation) between the first and second band structures for light emission. Further, in the second strain state, the material of the nanostructures 312 in the second band structure is suitable for light absorption and radiative recombination. The nanostructures 312 can also be composed of a material that is reversible between the first and second band structures upon application and removal of strain (e.g., mechanical strain). In embodiments in which the nanostructures 312 are composed of silicon, for example, the second strain state is axial or substantially axial. In other embodiments, however, this can vary.

In the illustrated embodiment, the diameter of the individual nanowires 312 (e.g., silicon nanowires) is typically less than 7 nm. and the length is approximately 5 nm or greater. These dimensions for the nanowires correspond, at least in part, to an emission wavelength range from deep UV to infrared depending on the bandgap of the material (different for Ge, Si, GaP etc.). In embodiments in which the nanowires 312 are composed of germanium, the diameter is typically less than 7 nm and the length is approximately 5 nm or greater. These dimensions for germanium nanowires correspond, at least in part, to an emission wavelength that is near infrared or in the mid-infrared range. In general, the bandgap energy varies with the diameter of the nanowire. Thus, for a given material, the optoelectronic device can be tuned to difference wavelengths by adjusting the dimensions of the nanowires 312 (e.g., diameter or aspect ratio of individual nanowires).

In one particular embodiment, the nanostructures 312 (e.g., nanowires) can be incorporated into a laser and the nanostructures 312 can be strain modulated between the first and second bandgaps. In the first bandgap structure, the laser is suitable for population inversion, which can be achieved optically or electrically. In the embodiment illustrated in FIG. 3B, the device 310 includes a first electrode 314 and a second electrode 316 coupled to opposite ends of the nanowires 312. The first and second electrodes 314 and 316 are used to electrically stimulate population inversion in the first strain state (which is associated with an indirect band gap in the band structure). For example, with silicon or germanium nanowires 312, the first strain state may be a zero or near-zero strain state.

Continuing with this particular example, the laser can then be modulated to the second strain state with direct bandgap structure for lasing (e.g., electron-hole recombination). Since the band structure is reversible, the strain modulation can be continuously applied to switch between population inversion and lasing modes in the laser. For silicon or germanium nanowires 312, the second strain state may be an axially or near axially strained state that is reached when increased tensile stress is applied. In another particular aspect of this embodiment, when incorporated with a laser, the nanowires 312 have a conductivity type that is opposite to that of the substrate layer 318, and population inversion can achieved by applying an electrical bias between the nanowires 312 and the substrate layer 318 when the nanowires 312 are in the first strain state (of indirect bandgap).

In another embodiment, the device 310 can include a stress inducer (not shown) coupled to the nanowires 312 such that, in operation, the strain inducer/unit causes mechanical stress in the nanowires 312 to induce the second strain state and/or to return to the first strain state (or any other suitable strain state). Further examples of strain inducers are described below with reference to FIGS. 4-6C.

In still another embodiment, the nanostructures 312 (e.g., nanowires) can be incorporated into a light emitting diode. In this embodiment, the nanostructures 312 are coupled to the first and second electrodes 314 and 316 for biasing the device 310. The nanostructures 312 in the light emitting diode can be fabricated or grown such that they are in the second strain state with the band structure that is suited for effective light emission. In addition, the nanowires 312 can be mechanically stressed after growth or fabrication to be in the second strain state. In still further embodiments, the nanostructures 312 can be incorporated into a photodiode and the photocurrent is collected via the first and second electrodes 314 and 316. Similarly, the nanostructures 312 may be incorporated into a solar cell in which solar light generated current is collected via the first and second electrodes 314 and 316.

Figure 3C:
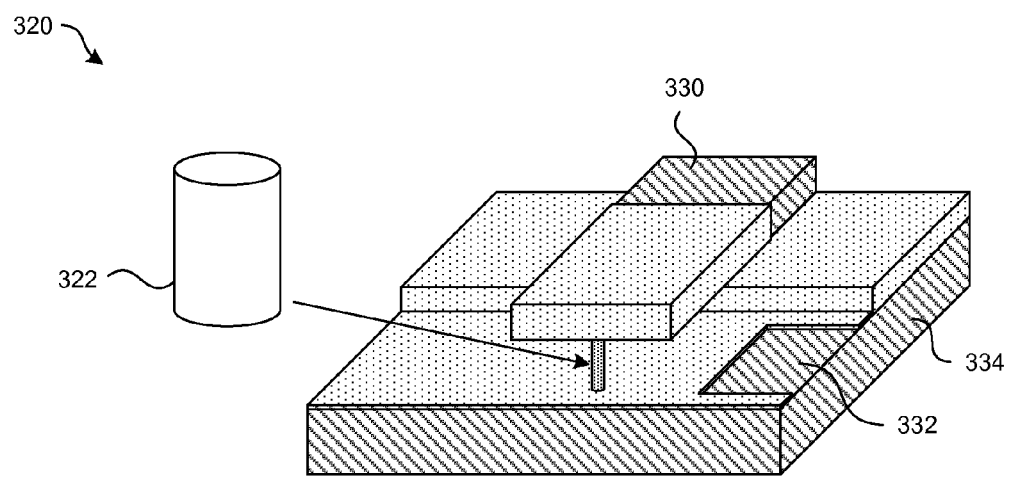
FIG. 3C is a schematic, isometric illustration of an example optoelectronic device having a nanostructure configured in accordance with still another embodiment of the disclosure.

FIG. 3C is a schematic, isometric illustration of a nanostructure 322 integrated for use with an optoelectronic device 320 in accordance with still another embodiment of the disclosure. In this example, the nanostructure 322 comprises a vertical nanowire or array of nanowires. In the illustrated embodiment, the device 320 includes a first electrode 330 and a second electrode 332 for electrically biasing a light emitting device or for collecting currents in light absorbing device. In other embodiments, however, the device 320 can have other arrangements and/or include different features.

Figure 4:
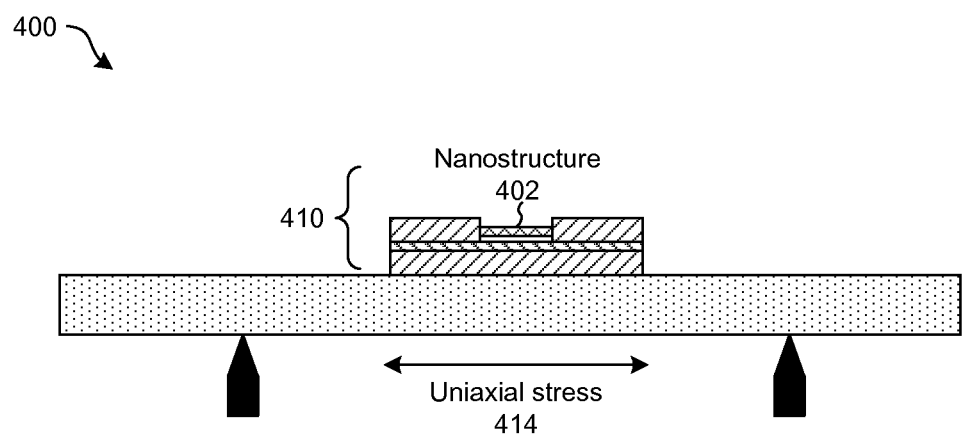
FIG. 4 is a schematic, cross-sectional side view of an optoelectronic device built on a platform suitable for application of mechanical stress in accordance with an embodiment of the disclosure.

FIG. 4 is a schematic, cross-sectional side view of an optoelectronic device 410 including a nanostructure 402 built or mounted on a platform 400 suitable for application of stress 414 in accordance with an embodiment of the disclosure. In this embodiment, the platform 400 is configured to apply stresses 414 to induce/modulate strain in the nanostructure 402. FIGS. 5A-6C provide additional examples of suitable topologies for the platform 400 and illustrate some examples of the various ways that stress can be applied to induce strain in the indirect bandgap nanostructure 402.

In optoelectronic devices that do not require population inversion, the nanostructure 402 can be fabricated with the desired strain or, alternatively, the platform 400 can be configured to hold the nanostructure 402 at the desired strain state for the nanostructure 402 to have a direct or near-direct band gap. For devices such as lasers that need to achieve population inversion for operation, the nanostructure 402 can be modulated between strain states to alternate the band structure between indirect and (near) direct states, suitable for population inversion and lasing, respectively.

The strain state modulation can be performed via application of stress, e.g., by a straining unit coupled to the active region such that in operation the straining unit induces mechanical stress in the nanowire structure 402. In this way, the nanowire structure 402 reaches a second strain state in which the bandgap becomes direct or substantially direct and (when in operation) emits photons upon electron-hole recombination. Additional examples of suitable straining units are described below with reference to FIGS. 5A-6C.

Figure 5A:
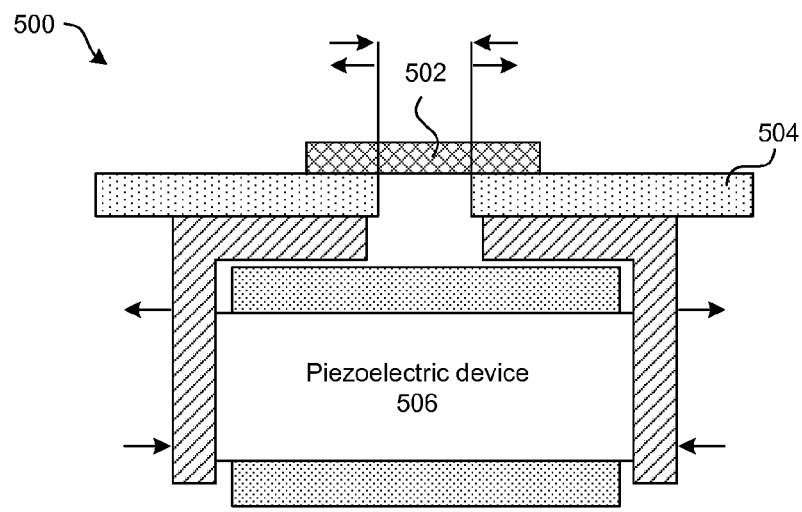
FIG. 5A is a schematic, cross-sectional side view of a nanostructure-based optoelectronic device coupled to a piezoelectric-based straining unit configured in accordance with another embodiment of the disclosure.

FIG. 5A is a schematic, cross-sectional side view of a nanowire-based optoelectronic device 500 coupled to a piezoelectric device-based straining unit 506 configured in accordance with another embodiment of the disclosure. The device 500 includes a plurality of nanowires or a nanowire array 502 in the active region of the optoelectronic device 500. The nanowires 502 can be mounted or fabricated on a platform or substrate 504. The piezoelectric device 506 is configured to move (e.g., oscillate) mechanically in response to an electrical bias, and thereby causes mechanical stress in the nanowires 502 to induce strain.

The applied mechanical stress in the nanowires 502 can be axial and can cause compressive or tensile strain. In other embodiments, however, the stress can be applied in different directions (e.g., shear, normal, etc.) in the nanowires 502. In one particular example, the nanowires are comprised of silicon or germanium, and axial stress is applied to induce axial strain in the nanowires 502 for modulation between direct and indirect bandgap structures. In other embodiments, however, the nanowires 502 can be composed of different materials and/or the stresses can be applied in different directions.

Figure 5B:
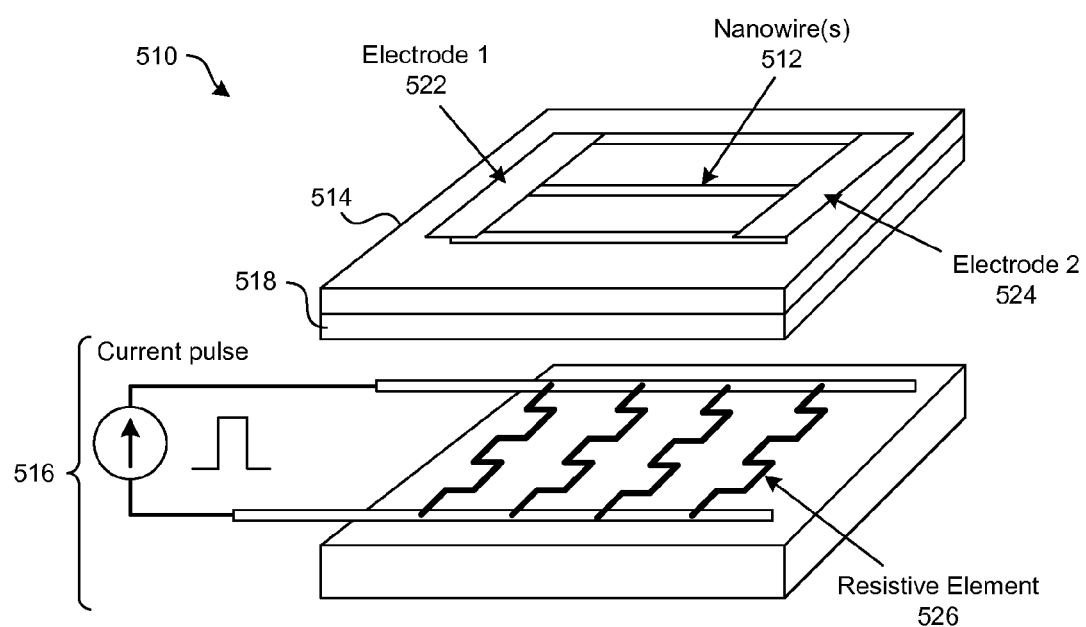
FIG. 5B is a schematic, isometric view of a nanowire-based optoelectronic device coupled to a straining unit configured in accordance with still another embodiment of the disclosure.

FIG. 5B is a schematic, cross-sectional side view of a nanowire-based optoelectronic device 510 coupled to a straining unit 516 configured in accordance with another embodiment of the disclosure. In this embodiment, the straining unit 516 is configured to use thermal expansion to apply strain. The optoelectronic device 510, for example, can be mounted on or fabricated from a first layer of material 514 and a second layer of material 518 having different thermal expansion coefficients. The straining unit can also include resistive elements 526. The resistive elements 526 can be made from resistors (e.g., polysilicon resistors) or any other suitable components. In operation, when current is applied/removed in the straining unit 516, the resistive elements 526 cool/heat, and thereby cause elongation or contraction of nanowire(s) 512 or other nanostructures used in the device 520. This elongation or contraction is configured to induce/eliminate strain for band structure manipulation.

Figure 6A:
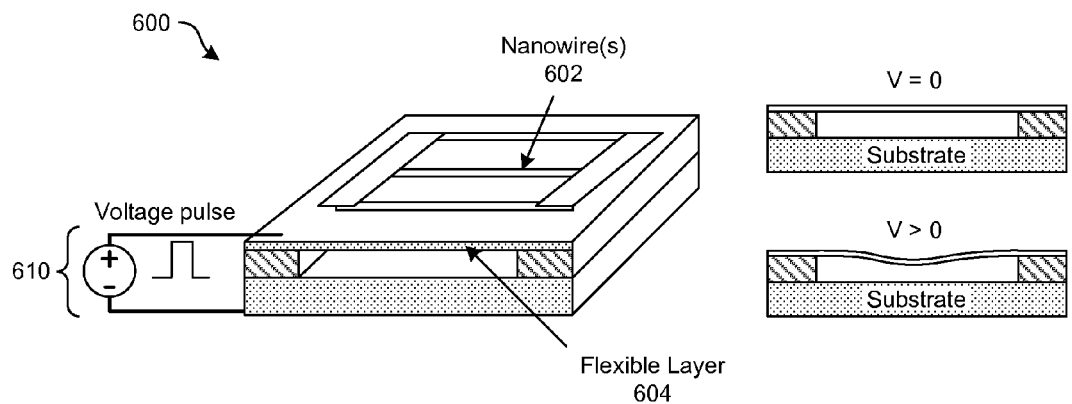
FIG. 6A-C are schematic, isometric views of additional examples of nanowire-based optoelectronic devices coupled to various straining units configured in accordance with still other embodiments of the disclosure.
Figure 6B:
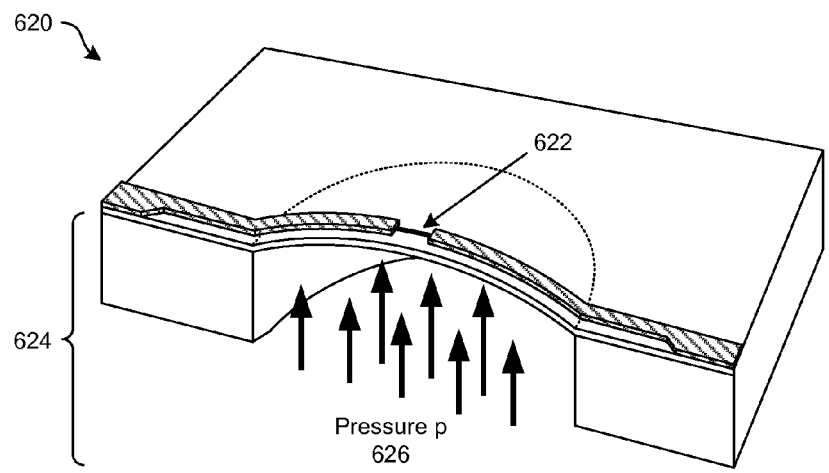
Figure 6C:
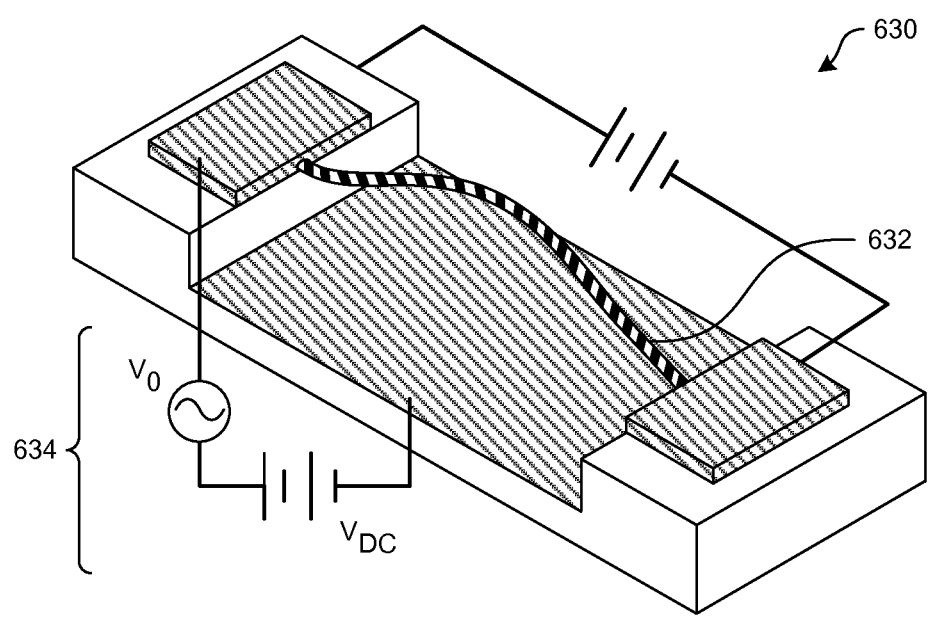

FIG. 6A-C are schematic, isometric views of additional examples of nanowire-based optoelectronic devices coupled to various straining units configured in accordance with still other embodiments of the disclosure. Referring first to FIG. 6A, for example, an optoelectronic device 600 is mounted on, coupled to, or integral with a straining unit 610 configured to use an electric field difference to modulate nanowire(s) 602. In operation, for example, an electrical pulse that generates a field/voltage difference can cause flexible layer 604 of the device 600 to be deflected, thereby straining the nanowire(s) 602.

Referring next to FIG. 6B, an optoelectronic device 620 comprising a nanostructure 622 is mounted on, coupled to, or integral with a straining unit 624 configured to operate based on fluidics. In this embodiment, for example, an injection of liquid, fluid, or air causes pressure P (as shown by reference number 626) that causes the nanostructure 622 to be deflected, thereby straining the nanostructure 622.

Referring next to FIG. 6C, an optoelectronic device 630 comprising a nanostructure 632 is coupled to or integral with a straining unit 634 that operates based on resonant methods or techniques. In this embodiment, for example, the straining unit 634 is configured to cause the nanostructure 632 (e.g., when the nanostructure 632 is biased) to oscillate mechanically (e.g., by applying an AC magnetic field or an AC electrical field). The oscillation can cause the nanostructure 632 to be periodically strain modulated and can be self-sustaining due to resistance change (e.g., piezo-resistivity).

In some materials, Auger recombination contributes to the non-radiative recombination of electrons and holes. Thus, to ensure that the electrons and holes combine radiatively, the strain application should be faster than the Auger recombination lifetime, or the frequency of strain application should be larger. In one example of a silicon nanowire, the Auger recombination life time is approximately 75 ns or approximately 13.3 MHz. The lifetime may be different for other nanowires (based on dimensions, material, etc.). Therefore, for effective light emission, the frequency of resonant silicon nanowires can be designed to be around or larger than 13.3 MHz.

Figure 7:
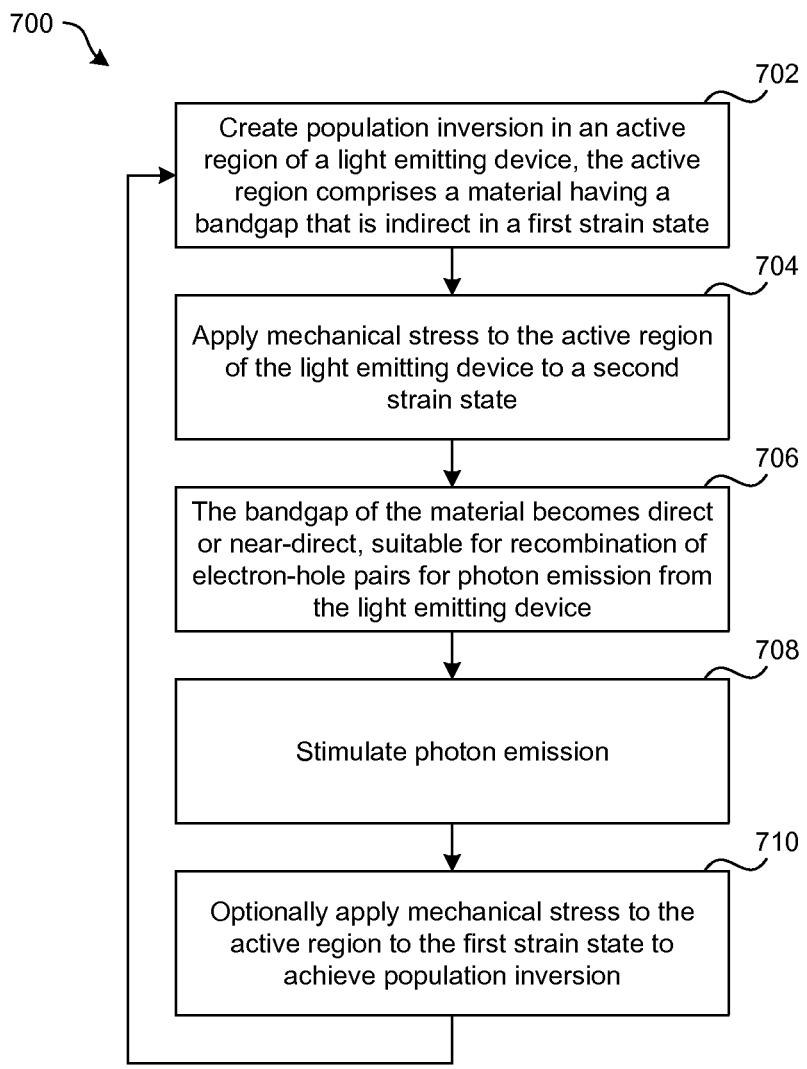
FIG. 7 is a flow chart illustrating stages of a process for using an indirect bandgap material for light emission in accordance with an embodiment of the disclosure.

FIG. 7 is a flow chart illustrating stages of a process 700 for using an indirect bandgap material for light emission in accordance with an embodiment of the disclosure. Beginning with block 702, population inversion is created in an active region of a light emitting device (e.g., laser).

The active region can include a material having a bandgap that is indirect in a first strain state and can include a nanostructure (e.g., nanowire, nanowire bridges or arrays, vertical nanowire, etc.). The nanostructure may also include one or more quantum dots or thin disks where the spontaneous emission rate can change due to a change in the symmetry of the wave function. The material can include silicon, germanium, silicon-germanium compound or any other materials or compounds with a band gap structure that can be altered between direct and indirect based on strain engineering. Block 702, however, can be omitted for an optoelectronic device that does not require population inversion to operate (e.g., LED, photodetector, solar cell, etc.).

The process can also be used for a direct bandgap material (e.g., GaAs, AlGaAs, GaN, InP, etc.) to enhance population inversion. For example, in the case of a material having a direct bandgap, the material can be strain modulated before population inversion is created. Thus, in this situation, the population inversion can be enhanced due to the increased lifetime of carriers in the indirect bandgap.

In block 704, mechanical stress is applied to the active region of the light emitting device to a second strain state. In block 706, the bandgap of the material becomes direct or near-direct, which is suitable for recombination of electron-hole pairs for photon emission from the light emitting device to stimulate photon emission in block 708. In block 710, stress (e.g., mechanical, electrical, magnetic stress, etc.) is optionally applied to the active region to the first strain state to achieve population inversion. For silicon or germanium, the first strain state can be zero or near-zero strain state and the second strain state can be an axial strained state.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number, respectively. Additionally, the words "herein," "above," and "below" and words of similar import, when used in this application, shall refer to this application as a whole and not to any particular portions of this application.

The description of embodiments of the disclosure is not intended to be exhaustive or to limit the disclosure to the precise form disclosed. For example, many of the examples discussed herein include materials such as silicon, germanium, silicon germanium alloy ($Si_{1-x}Ge_x$) GaP, BN, SiC, and/or $Al_xGa\neg1\text{-}xAs$. A number of additional materials, however, in which the band structure can be reversibly modulated between indirect or direct/near-direct forms via strain manipulation (e.g., by applying or removing strain) are considered to be within the scope of this disclosure. Furthermore, while specific embodiments of, and examples for, the disclosure are described herein for illustrative purposes, various equivalent modifications are possible within the scope of the disclosure, as those skilled in the relevant art will recognize. For example, while process steps or functions are presented in a given order, alternative embodiments may perform functions in a different order, or functions may be performed substantially concurrently. The teachings of the disclosure provided herein can be applied to other systems, not only the system described herein. The various embodiments described herein can be combined to provide further embodiments.

All of the references cited herein are incorporated by reference. Aspects of the disclosure can be modified, if necessary, to employ the systems, functions and concepts of the above references and application to provide yet further embodiments of the disclosure. These and other changes can be made to the disclosure in light of the Detailed Description.

Specific elements of any of the foregoing embodiments can be combined or substituted for elements in other embodiments. Furthermore, while advantages associated with certain embodiments of the disclosure have been described in the context of these embodiments, other embodiments may also exhibit such advantages, and not all embodiments need necessarily exhibit such advantages to fall within the scope of the disclosure. Accordingly, embodiments of the disclosure are not limited except as by the appended claims.

We claim:

1. A semiconductor laser, comprising:
    an active region having a nanowire structure formed from a semiconductor material, wherein the nanowire structure of the semiconductor material has a bandgap;
    a strain modulator operably coupled to the active region, wherein the strain modulator is configured to apply a mechanical force to the nanowire structure to reversibly vary the nanowire structure between a first strain state and a second strain state upon application and removal, respectively, of the mechanical force;
    wherein, in the first strain state, the bandgap is indirect or substantially indirect and causes, within the active region, a number of electrons in a higher energy state to increase relative to a number of electrons in a lower energy state such that electrons can accumulate without recombining with holes;
    wherein, in the second strain state, the bandgap is direct or substantially direct and triggers emission of photons upon electron-hole recombination; and
    wherein the straining unit is configured to apply the first and/or second strain at a frequency around and/or larger than an Auger recombination lifetime.

2. The semiconductor laser of claim 1 wherein the nanowire structure includes a first end and a second end opposite the first end, and wherein the first and second ends of the nanowire structure are electrically coupled to first and second electrodes, respectively, for electrically stimulating population inversion when the bandgap is indirect.

3. The semiconductor laser of claim 1 wherein an emission wavelength of the laser is tunable by selecting a diameter or strain level of the nanowire structure.

4. The semiconductor laser of claim 1 wherein the strain modulator is configured to continuously switch between a population inversion mode and a lasing mode.

5. A semiconductor laser comprising:
    an active region having a nanowire structure formed from a semiconductor material, wherein the nanowire structure of the semiconductor material has a bandgap;
    a strain modulator operably coupled to the active region, wherein the strain modulator is configured to apply a mechanical force to the nanowire structure to reversibly vary the nanowire structure between a first strain state and a second strain state upon application and removal, respectively, of the mechanical force;
    wherein, in the first strain state, the bandgap is indirect or substantially indirect and causes, within the active region, a number of electrons in a higher energy state to increase relative to a number of electrons in a lower energy state such that electrons can accumulate without recombining with holes;
    wherein, in the second strain state, the bandgap is direct or substantially direct and triggers emission of photons upon electron-hole recombination; and
    wherein the strain modulator is configured to alternately apply and remove the mechanical force at a frequency around and/or larger than an Auger recombination lifetime of the nanowire structure.

* * * * *